(12) United States Patent
Takahashi

(10) Patent No.: US 6,518,810 B1
(45) Date of Patent: Feb. 11, 2003

(54) LATCH CIRCUIT AND REGISTER CIRCUIT

(75) Inventor: Hiroyuki Takahashi, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/594,934

(22) Filed: Jun. 15, 2000

(30) Foreign Application Priority Data

Jun. 16, 1999 (JP) .......................................... 11-169769

(51) Int. Cl.⁷ .............................................. H03K 3/289
(52) U.S. Cl. ..................................... 327/202; 327/203
(58) Field of Search ................................ 327/202, 203, 327/208, 209, 210, 211, 212, 218

(56) References Cited

U.S. PATENT DOCUMENTS

| 4,691,122 A | * | 9/1987 | Schnizlein et al. | ......... 327/203 |
| 4,843,254 A | * | 6/1989 | Motegi et al. | ............... 327/203 |
| 5,654,658 A | * | 8/1997 | Kubota et al. | ............... 327/202 |
| 5,999,030 A | * | 12/1999 | Inoue | ........................ 327/202 |

FOREIGN PATENT DOCUMENTS

| JP | 60-198916 | 10/1985 |
| JP | 4-83414 | 3/1992 |
| JP | 04-181599 | 6/1992 |
| JP | 5-160682 | 6/1993 |
| JP | 8-250983 | 9/1996 |
| JP | 9-223393 | 8/1997 |

* cited by examiner

*Primary Examiner*—Tuan T. Lam
(74) *Attorney, Agent, or Firm*—Katten Muchin Zavis Rosenman

(57) ABSTRACT

A latch circuit for temporarily storing an input signal and successively outputting the input signal is disclosed, that comprises an input transfer circuit for inputting a reference clock signal, a first inverter for inverting an output signal of the input transfer circuit, a second inverter for inverting an output signal of the first inverter, and a hold transfer circuit for inputting an output signal of the second inverter and outputting it to the first inverter, wherein a second clock signal is input to the gate of the hold transfer circuit, the signal level of the second clock signal becoming high with a predetermined delay against a leading edge of the reference clock signal and becoming low corresponding to a trailing edge of the reference clock signal.

19 Claims, 6 Drawing Sheets

LATCH CIRCUIT AND REGISTER CIRCUIT

BACKGROUND OF THE INVENTION

1. Field of the Invention

The present invention relates to a latch circuit for temporarily storing and successively outputting data corresponding to an input signal and to a register circuit having a plurality of stages of the latch circuits.

2. Description of the Related Art

With reference to FIG. 1, a conventional register circuit and a clock signal for controlling the register circuit will be described.

Referring to FIG. 1, two stages of latch circuits are disposed as a master side latch circuit and a slave side latch circuit. The master side latch circuit and the slave side latch circuit are connected. At a leading edge of a clock signal CLK, input data is received from a data input terminal IN and output from a register output terminal OUT. As shown in FIG. 1, when the signal level of the clock signal CLK is low, the master side latch circuit directly outputs the input data to a connection point Pm. The slave side latch circuit receives the input data from the connection point Pm and latches the input data.

When the signal level of the clock signal CLK is high, the register circuit shuts out the input data of the master side latch circuit and holds (latches) inner data Pm. However, since the slave side latch circuit becomes a through state, the slave side latch circuit still outputs the inner data Pm to an output terminal OUT. Since the signal level of the clock signal CKL alternatively changes from high to low, when the signal level of the clock signal CLK changes from low to high, the data is output to the output terminal OUT.

Next, for simplicity, the structure of the master side latch circuit will be described. The input data is input to an input transfer circuit composed of a PMOS M31 and an NMOS M32 whose drain and source are connected in parallel. The clock signal CLK and an inverted clock signal CLKB are input to the gate of the PMOS M31 and the NMOS M32 of the input transfer circuit, respectively. An output terminal of the transfer circuit is connected to an output driving inverter INV 31. The inverter INV 31 outputs data to the connection point Pm. The data that is output from the connection point Pm is input to an inverter INV 32. Output data of the inverter INV 32 is output to a hold transfer circuit composed of a PMOS M33 and an NMOS M34. An output terminal of the hold transfer circuit is connected to the input terminal of the inverter INV 31.

The clock signals CLKB and CLK are input to the gates of the PMOS M33 and the NMOS M34 of the hold transfer circuit, respectively. This structure applies to the slave side latch circuit. In the slave side latch circuit, input data is input from the connection point Pm and data is output from the output terminal OUT. On the slave side latch circuit, however, the clock signals CLK and CLKB are input to NMOS transistors and PMOS transistors, respectively. In other words, the clock signals CLK and CLKB are input to an NMOS M35 and a PMOS M36 of the input transfer circuit, respectively. The clock signals CLK and CLKB are input to an NMOS M37 and a PMOS M38 of the hold transfer circuit, respectively.

When the latch circuit is in the through state, the input transfer circuit is turned on and the hold transfer circuit is turned off. Thus, the input data can be output to the connection point of the latch circuit through one inverter. On the other hand, when the latch circuit is in the latch state, the input transfer circuit is turned off and the hold transfer circuit is turned on. Thus, in the latch state, the input data is shut out. Just before the latch state takes place, the output data is output to the input terminal of the output inverter through the hold inverter. Thus, the data can be held in a flip-flop structure.

The latch circuit is switched between the latch state and the through state with the clock signals CLK and CLKB. A register circuit is composed of two latch circuits that are connected in series in such a manner that the clocks signals CLK and CLKB are input to the latch circuits in the reverse relation. Corresponding to the high and low levels of the clock signals, the register circuit successively outputs input data.

Tanaka et al. have disclosed a flip-flop circuit as Japanese Patent Laid-Open Publication No. 60-198919 (hereinafter referred to as first related art reference). The flip-flop circuit is a one-bit flip-flop circuit used as a driving circuit for an LCD (Liquid Crystal Display) apparatus. The flip-flop circuit is a register circuit composed of a first (master) latch circuit and a second (slave) latch circuit. With a logic circuit using a clock signal and a control signal, both the latch circuits are placed in a through state. The flip-flop circuit has a circuit structure for switching between a synchronous function for receiving data corresponding to a clock edge and an asynchronous function for directly receiving data asynchronous to the clock signal. However, this flip-flop circuit does not handle a low frequency input signal and a high frequency input signal. In addition, the circuit does not operate with only the synchronous function.

Noisshiki et. al. have disclosed a flip-flop circuit for a high speed logic frequency circuit as Japanese Patent Laid-Open Publication No. 5-160682 (hereinafter referred to as second related art reference). In the second related art reference, a clock signal is used in common with an input transfer circuit and a hold transfer circuit.

In the conventional register circuits, two transfer circuits (namely, gates of four MOS transistors) should be switched for each latch circuit. When a register is composed of two latch circuits, the load of eight transistors is applied to a clock signal as a control signal. Since a latest large scale LSI having many input/output signals use many registers, the load applied to the clock signal is very heavy. In addition, as the operation frequency of the LSI is rising, it is necessary to drive each register at high speed and prevent registers from skewing with the clock signal.

Thus, in the conventional register circuits, viewed from a clock signal, the capacitance between the gate and source of the input transfer circuit and the capacitance between the gate and drain of the hold transfer circuit tend to become large. This problem is a drawback that restricts the high speed operation of the register circuits.

In other words, the clock signal that is input to a register should drive four transfer circuits that are a data receiving master side input transfer circuit, a data releasing slave side input transfer circuit, a data latching master side hold transfer circuit, and a data latching slave side hold transfer circuit. These transfer circuits are essential for the operation of the register. However, since these transfer circuits are driven with one clock signal and an inverted clock signal thereof, the load applied thereto becomes large.

SUMMARY OF THE INVENTION

An object of the present invention is to allow a clock signal that is input to a latch circuit including an input transfer circuit and a hold transfer circuit and a register circuit composed of a plurality of stages of latch circuits to be improved.

A first aspect of the present invention is a latch circuit for temporarily storing an input signal and successively outputting the input signal, comprising an input transfer circuit for inputting and outputting the input signal corresponding to a reference clock signal supplied to a control gate of said input transfer circuit, a first inverter for inverting an output signal of the input transfer circuit, a second inverter for inverting an output signal of the first inverter, and a hold transfer circuit for inputting an output signal of the second inverter and outputting it to the first inverter, wherein a second clock signal is input to the gate of the hold transfer circuit, the signal level of the second clock signal becoming high with a predetermined delay against a leading edge of the reference clock signal and becoming low corresponding to a trailing edge of the reference clock signal.

A second aspect of the present invention is a register circuit, comprising a plurality of latch circuits disposed in a plurality of stages, wherein each of the plurality of latch circuits has an input transfer circuit for inputting a reference clock signal, a first inverter for inverting an output signal of the input transfer circuit, a second inverter for inverting an output signal of the first inverter, and a hold transfer circuit for inputting an output signal of the second inverter and outputting it to the first inverter, wherein a first stage latch circuit is a master side register circuit, wherein the input transfer circuit is connected to an output terminal of the second inverter so as to form a slave side register circuit, and wherein a third clock signal is input to the gate of the hold transfer circuit of the master side register circuit, the signal level of the third clock signal becoming high with a predetermined delay against a leading edge of the reference clock signal and becoming low corresponding to a trailing edge of the reference clock signal.

A third aspect of the present invention is a latch circuit for temporarily storing an input signal and successively outputting the input signal, comprising a first switch for taking in the input signal by ON, a first clock generator for generating a first clock and controlling ON/OFF of said first switch, a hold circuit for holding the input signal through said first switch and, after that, outputting the input signal, and a second clock generator for generating a second clock and controlling an ON/OFF operation of said hold circuit, wherein the second clock is different from the first clock by predetermined phase.

According to the present invention, signals for controlling the transfer circuit of the master side latch circuit and the slave side latch circuit of the register circuit are generated corresponding to respective clock signals, when these signals are operated at a high frequency, they are turned of f. Thus, the load of the clock signal lines for controlling the operation of the register is reduced. In addition, the data releasing operation of the register is performed at high speed. Moreover, when the register is operated at a high frequency, the power consumption of the register can be suppressed from increasing.

These and other objects, features and advantages of the present invention will become more apparent in light of the following detailed description of a best mode embodiment thereof, as illustrated in the accompanying drawings.

DESCRIPTION OF PREFERRED EMBODIMENTS

Next, with reference to the accompanying drawings, embodiments of the present invention will be described in detail.

[First Embodiment]

(1) Description of Structure

Figure 1:
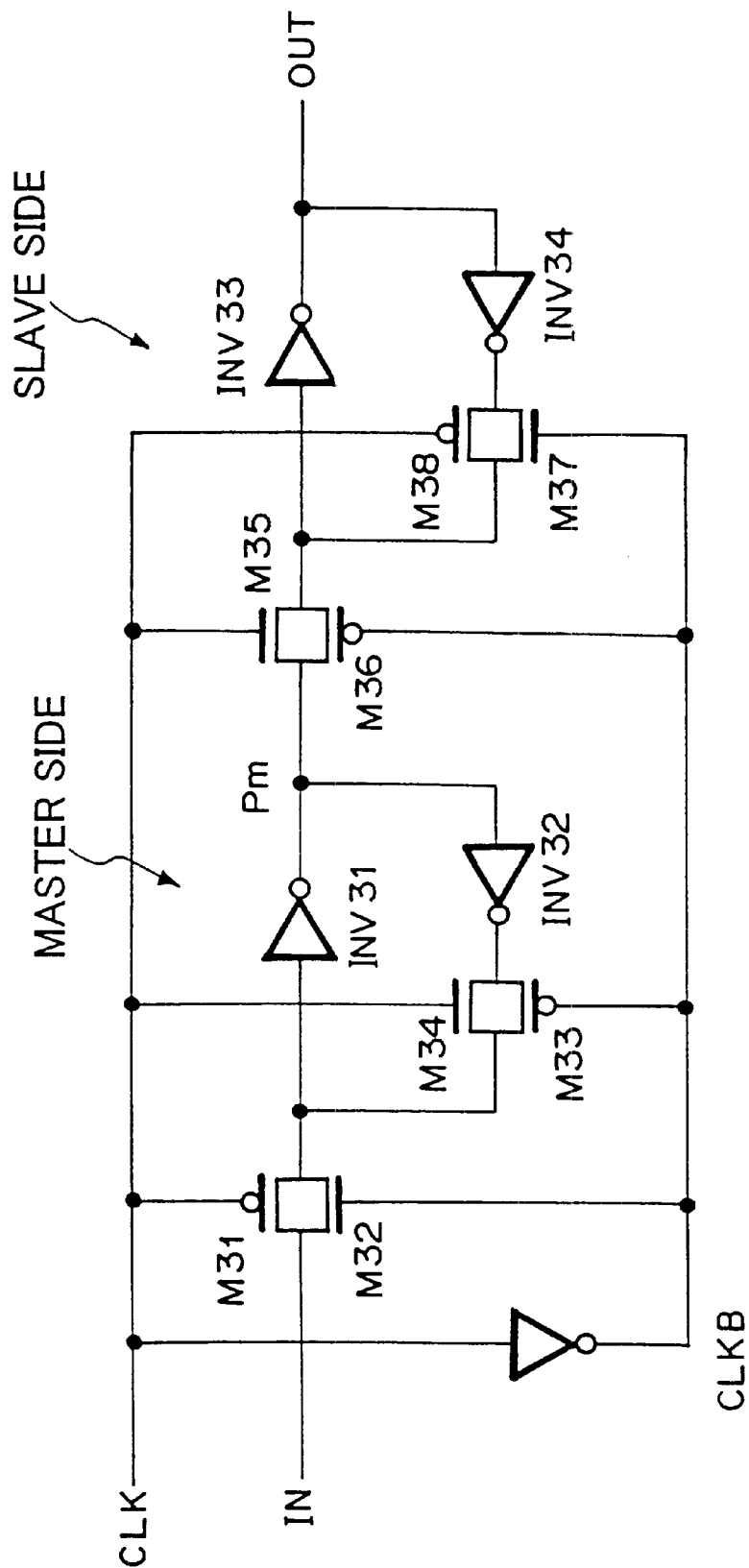
FIG. 1 is a schematic diagram showing the structure of a latch circuit and a register circuit of a related art reference.
Figure 2:
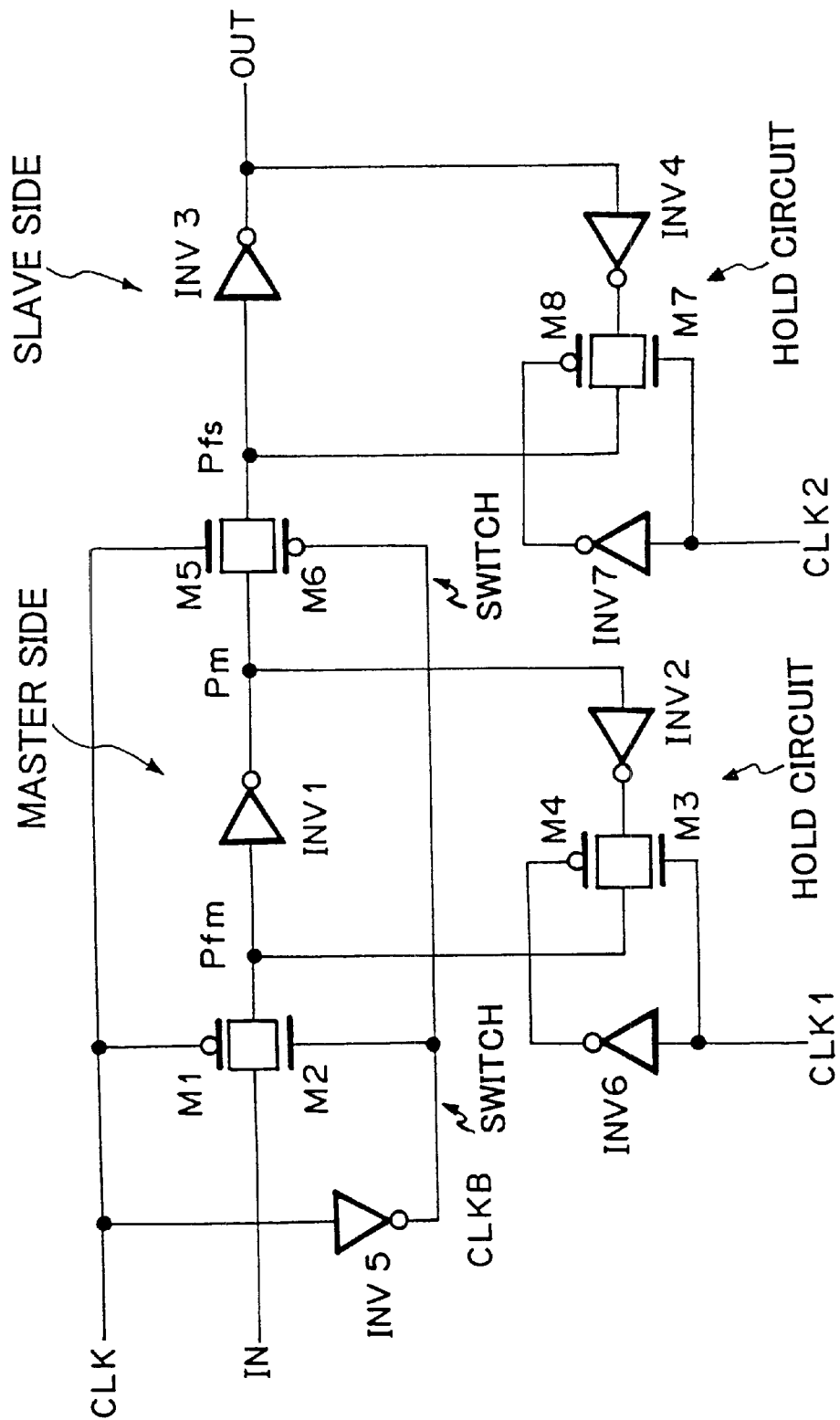
FIG. 2 is a schematic diagram showing the structure of a latch circuit and a register circuit according to a first embodiment of the present invention.

With reference to FIG. 2, a first embodiment of the present invention will be described. FIG. 2 shows the structure of a latch circuit and a register circuit. Referring to FIG. 2, two stages of latch circuits are connected in series. The first stage of the latch circuit is a master side latch circuit. Data is input from an input terminal IN. Input data is output from a connection point Pm. The second stage of the latch circuit is a slave side latch circuit. In data is input from the connection point Pm. Input data is output from a data output terminal OUT.

First, the master side latch circuit will be described in detail. Input data received from the input terminal IN is input to an input transfer circuit (first switch) composed of a PMOS M1 and an NMOS M2 whose source and drain are connected in parallel, respectively. A clock signal CLK is input to the gate of the PMOS M1. An inversed clock signal CLKB of the clock signal CLK is output to the gate of the NMOS M2 through an inverter INV 5. An output terminal of the input transfer circuit is connected to an output driving inverter INV1. Output data of the inverter INV1 is output to the connection point Pm. Output data of the connection point Pm is output to a latch pass inverter INV2. Output data of the inverter INV2 is output to a hold transfer circuit composed of an NMOS M3 and a PMOS M4. Output data of the hold transfer circuit is output to a connection point Pfm that is an input terminal of the inverter INV1. Here, the inverters INV1 and INV2 and the hold transfer circuit M3 and M4 construct a hold circuit.

A clock signal CLK1 is input to the gate of the NMOS M3 of the hold transfer circuit. An inverted clock signal of the clock signal CLK1 is input to the gate of the PMOS M4 of the hold transfer circuit through an inverter INV6.

The structure of the master side latch circuit is the same as the structure of the slave side latch circuit. The clock signal CLK is input to the gate of an NMOS M5 of an input side transfer circuit. The inverted clock signal CLKB of the clock signal CLK is input to the gate of a PMOS M6 of the input side transfer circuit. However, a clock signal CLK2 is input to the gate of a PMOS M7 of a hold transfer circuit. An inverted clock signal of the clock signal CLK2 is input to the gate of an NMOS M8 of the hold transfer circuit.

(2) Description of Operation

Next, with reference to FIG. 2, the operation of the first embodiment will be descried. When the signal level of the clock signal CLK changes from high to low, the input transfer circuit (Ml and M2) of the master side latch circuit is turned on. Thus, the input transfer circuit (M1 and M2) become the through state. Consequently, the input data is input to the connection point Pm through an inverter. At this point, since the signal level of the clock signal CLK1 is fixed in the low level, the hold transfer circuit is kept off. On the other hand, when the signal level of the clock signal CLK changes from low to high, the input transfer circuit is turned off. Thus, the signal level of the connection point Pfm becomes floating state. Consequently, the voltage of the input data is kept in the level that takes place just before the input transfer circuit is turned off. This state is a latch state. After a predetermined time period elapses, the signal level of the clock signal CLK1 becomes high. Thus, the hold transfer circuit is turned on. The input data at the connection point Pm is input to the input terminal of the inverter INV1. As a result, a flip-flop circuit is structured. Thus, data can be held as a circuit. At this point, the output data of the inverter INV1 is inverted data at the connection point Pm.

The operation of the slave side latch circuit is the same as the operation of the master side latch circuit except that when the signal level of the clock signal CLK becomes high, the slave side latch circuit becomes the through state; when the signal level of the clock signal CLK becomes low, the slave side latch circuit becomes the latch state. In addition, the hold transfer circuit is controlled with the clock signal CLK2 instead of the clock signal CLK1. However, the controlling method for the hold transfer circuit of the slave side latch circuit is the same as that of the master side latch circuit.

The register circuit is operated by controlling the through state and the latch state of the master side latch circuit and the slave side latch circuit corresponding to the signal state of the clock signal CLK. Thus, at a leading edge of the clock signal CLK, the input data received from the input terminal IN is latched to the master side latch circuit and output to the output terminal OUT through the slave side latch circuit.

When the signal level of the clock CLK becomes low, the input data is latched by the slave side latch circuit. Thus, the output data at the output terminal OUT does not vary. At this point, since the master side latch circuit becomes the through state, the subsequent input data can be input from the input terminal IN.

Figure 3:
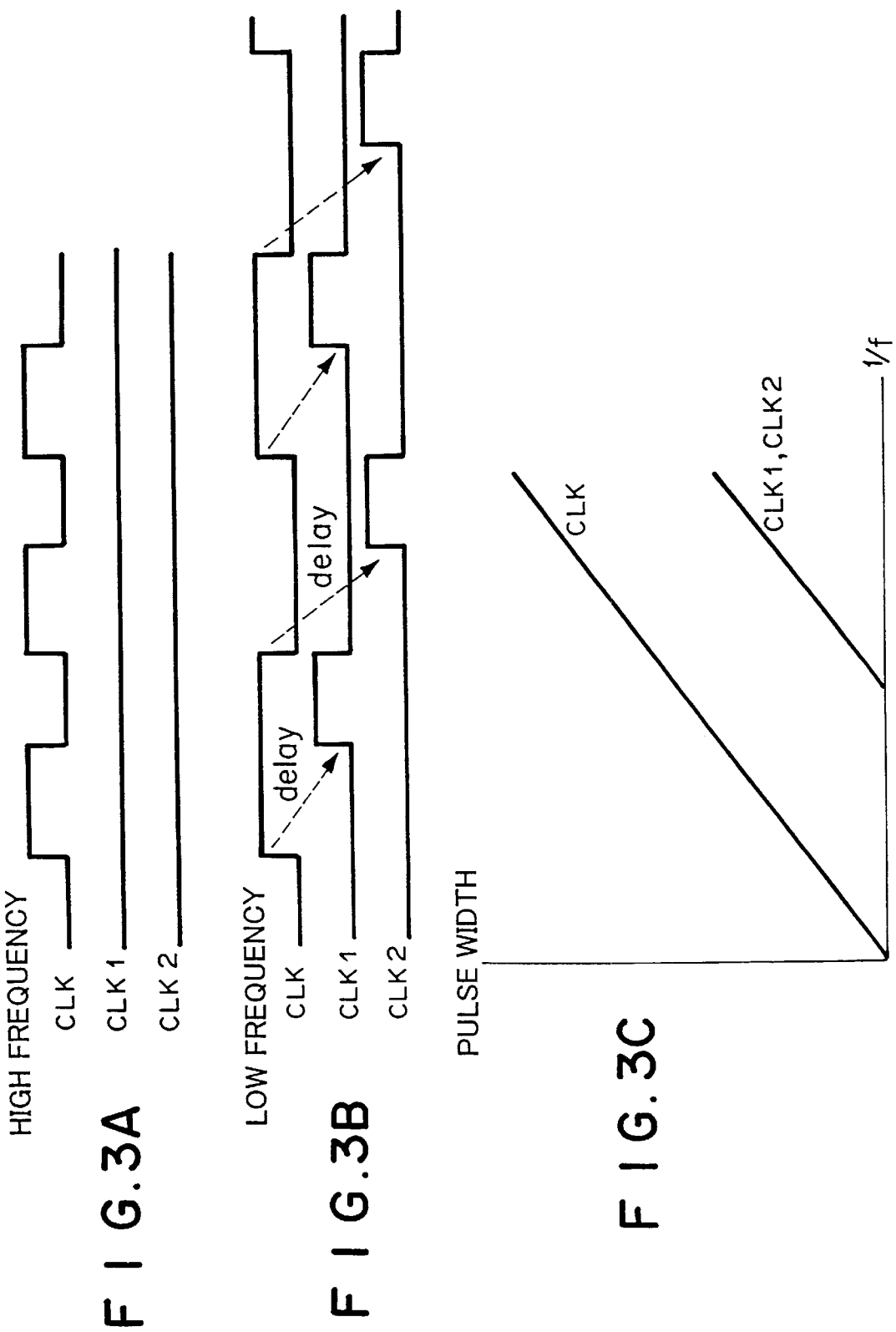
FIGS. 3A, 3B, and 3C are schematic diagrams for explaining the operation of the latch circuit and the register circuit according to the first embodiment of the present invention.

FIG. 3B is a timing chart showing the above-described operation in the case that the clock signal CLK is a low frequency signal. The pulse widths of the clock signals CLK1 and CLK2 can be given by the following formulas.

Pulse width of CLK1=$tKHKL$−$t$delay    (1)

Pulse width of CLK2=$tKLKH$−$t$delay    (2)

where tKHKL represents the pulse width on the high side of the clock signals CLK1 and CLK2; tKLKH represents the pulse width on the low side of the clock signals CLK1 and CLK2; and tdelay is a time period after the clock signal CLK becomes high until the clock signal CLK1 becomes high or a time period after the clock signal CLK becomes low until the clock signal CLK2 becomes high.

When the clock signal CLK is a high frequency signal and the relation of tKHKL <tdelay or the relation of tKLKH <tdelay is satisfied in the formulas (1) and (2), pulses of the clock signals CLK1 and CLK2 are not generated. FIG. 3A is a timing chart showing the relation among the clock signal CLK (high frequency signal), the clock signal CLK1, and the clock signal CLK2. In this case, the hold transfer circuits of the latch circuits are kept off state. Thus, when the clock signal CLK is a high frequency signal, since the time period tdelay is constant, the hold transfer circuits are not operated. In other words, they are as if they were absent. Thus, in these circuits, since the number of transistors driven with the clock signal CLK is as small as the half of the conventional circuits, the load applied to the clock signal CLK decreases and the register circuit operates at high speed. Thus, the registers are less skewed.

When the clock signal CLK is a high frequency signal, since the clock signals CLK1 and CLK2 are not generated. Thus, the power consumption of the clock signals CLK1 and CLK2 reduces. In the slave side latch circuit, it is not necessary to turn off the hold transfer circuit. Thus, only the circuit that outputs data is operated (namely, the input transfer circuit is turned on). Consequently, a current fluctuation due to the circuit switching operation does not take place. Thus, the time period after the clock signal CLK is input until data is released can be shortened.

When the clock signal CLK is a low frequency signal, the signal level of the connection point Pfm of the input transfer circuit (M1 and M2) of the master side latch circuit and the signal level of the connection point Pfs of the input transfer circuit (M5 and M6) of the slave side latch circuit are in floating state. However, after data is latched until a constant time period tdelay elapses, the clock signals CKL1 and CLK2 are input. Thus, the data can be stably latched. The time period tdelay can be designated corresponding to an unstable factor (such as noise) of the product.

The clock signals CLK1 and CLK2 can be easily generated by a logic circuit similar to the generating circuit for the clock signal CLK. With a signal of which a leading edge of the clock signal CLK is delayed by a delaying circuit, a leading edge of the clock signal CLK1 can be generated. On the other hand, with a signal of which a trailing edge of the clock signal CLK is delayed by a delaying circuit, a leading edge of the clock signal CLK2 can be generated. Trailing edges of the clock signals CLK1 and CLK2 can be generated so that they match a leading edge and a trailing edge of the clock signal CLK. FIG. 3C shows the relation among cycle time periods and pulse widths of the clock signals CLK, CLK1, and CLK2.

As shown in FIG. 3C, the cycle time period (1/f) is reversely proportional to the frequency. Thus, when the clock signal CLK is an high frequency signal, the pulse width thereof is narrow. Likewise, when the clock signal CLK is a high frequency signal, the pulse widths of the clock signals CLK1 and CLK2 are narrow. As shown in FIG. 3C, when the signal level of the clock signal CLK frequently varies from high to low, the clock signals CLK1 and CLK2 are not generated. [Second Embodiment]

Figure 4:
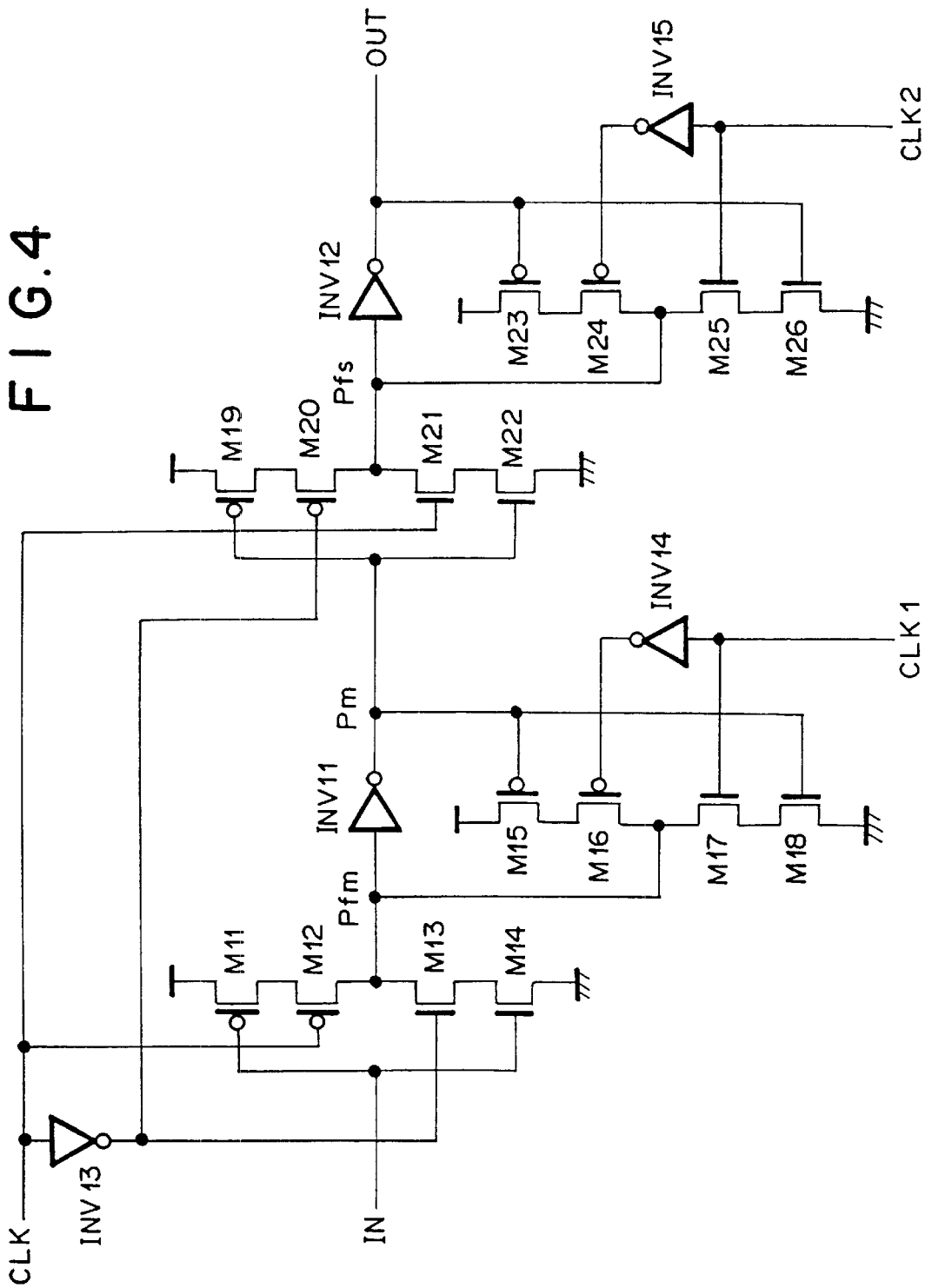
FIG. 4 is a schematic diagram showing the structure of a latch circuit and a register circuit according to a second embodiment of the present invention.

FIG. 4 shows the structure of a second embodiment of the present invention. According to the second embodiment, clocked inverter circuits are used instead of transfer circuits. A clocked inverter circuit composed of a PMOS (M11), a PMOS (M12), an NMOS (M13), and an NMOS (M14) is disposed in series between a power supply and a reference voltage. Input data received from an input terminal IN is input to the gates of the PMOS (M11) and the NMOS (M14). A clock signal CLK is input to the gate of the PMOS (M12). An inverted clock signal CLKB of the clock signal CLK is input to the NMOS (M13) through an inverter INV 13. A clock signal CLK1 is input to the gate of an NMOS (M17). An inverted clock signal of the clock signal CLK1 is input to the gate of a PMOS (M16) through an inverter INV 14. A clock signal CLK2 is input to the gate of an NMOS (M25). An inverted clock signal of the clock signal CLK2 is input to the gate of a PMOS (M24) through an inverter INV 15. Output data of the input transfer circuit (M11 to M14) is output to a connection point Pm through an inverter INV 11. Output data of the hold transfer circuit (Ml9 to M22) is input to a connection point Pfs. The output data received from the connection point Pfs is input to an output terminal OUT through an inverter INV 12. A hold transfer circuit (M15 to M18) inputs data received from the connection point Pm and outputs the data to the connection point Pfm. A hold transfer circuit (M23 to M26) inputs data received from the output terminal OUT and outputs the data to the connection point Pfs.

The operation of the register circuit according to the second embodiment shown in FIG. 4 is theoretically the same as the operation of the register circuit according to the first embodiment shown in FIG. 2. Since the register circuit shown in FIG. 4 transfers and shuts out a signal as an inverter circuit, the register circuit also operates as a buffer circuit. The register circuit according to the second embodiment may operate at high speed depending on the load of a downstream circuit thereof and characteristics of transistors thereof.

Since the signal level of the connection points of the latch circuits temporarily becomes floating state, when the input data received from the input terminal IN varies, the connection points of the latch circuits should be protected from noise. Thus, data should be input to the power supply side of the clocked inverter circuit (PMOS and NMOS), whereas a clock signal should be input to the drain output side. The master side circuit and the slave side circuit may be different circuits corresponding to the first embodiment and/or second embodiment.

[Third Embodiment]

Figure 5:
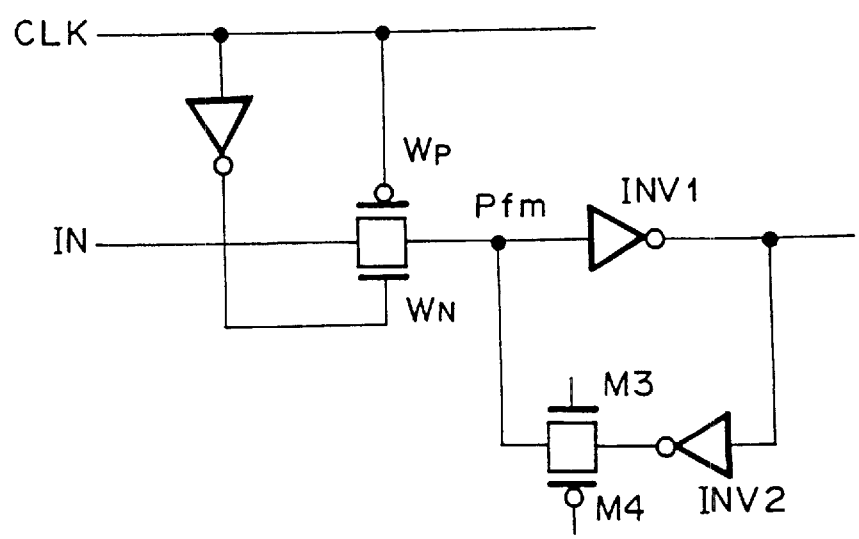
FIG. 5 is a schematic diagram showing the structure of a latch circuit according to a third embodiment of the present invention.

FIG. 5 shows the structure of a third embodiment of the present invention. According to the third embodiment, the stability of the buffer circuit is improved in a floating period after a latch state in which the operation of the buffer circuit is the most unstable in the first embodiment until hold pulses are output. FIG. 5 shows the structure of only a master side latch circuit. However, the structure of the master side latch circuit is the same as the structure of a slave side latch circuit. The size of a PMOS (Wp) of the data input transfer circuit is the same as the size of an NMOS (Wn) thereof.

When data is latched, the voltage fluctuates at the floating connection point Pfm due to noise. The voltage fluctuation takes place due to the stray capacitance (Cgp) between the gate and drain of a PMOS of a transfer circuit and the stray capacitance (Cgn) between the gate and drain of an NMOS thereof in the case that the clock signal CLK is input to the PMOS (Wp) and the NMOS (Wn).

Normally, a latch circuit is designed so that the size of a PMOS is twice as large as the size of an NMOS (the difference of their performances is twice due to the difference of mobilities). In other words, the difference of the performances of transistors is compensated with the gate width W. Thus, the delay time of an inverter logic circuit is prevented from depending on data. However, in a transfer circuit, the output level is raised and lowered by a PMOS and an NMOS, respectively. Thus, the difference of performances corresponding to the types of transistors is not affected by input data. As a result, the latch circuit can be designed so that the gate width W of a PMOS is the same as that of an NMOS as long as the latch circuit is not affected by input data. When there is a difference of stray capacitance Cgd between a PMOS and an NMOS, the difference should be compensated with the width W. The optimum transistor width is given by the following formula.

$$Cgp\ Wp = Cgn\ Wn \tag{3}$$

Thus, when data is latched to a latch circuit, noise at the floating connection point is offset by the PMOS side and the NMOS side. Consequently, the voltage fluctuation due to noise does not take place at the connection point.

[Fourth Embodiment]

Figure 6:
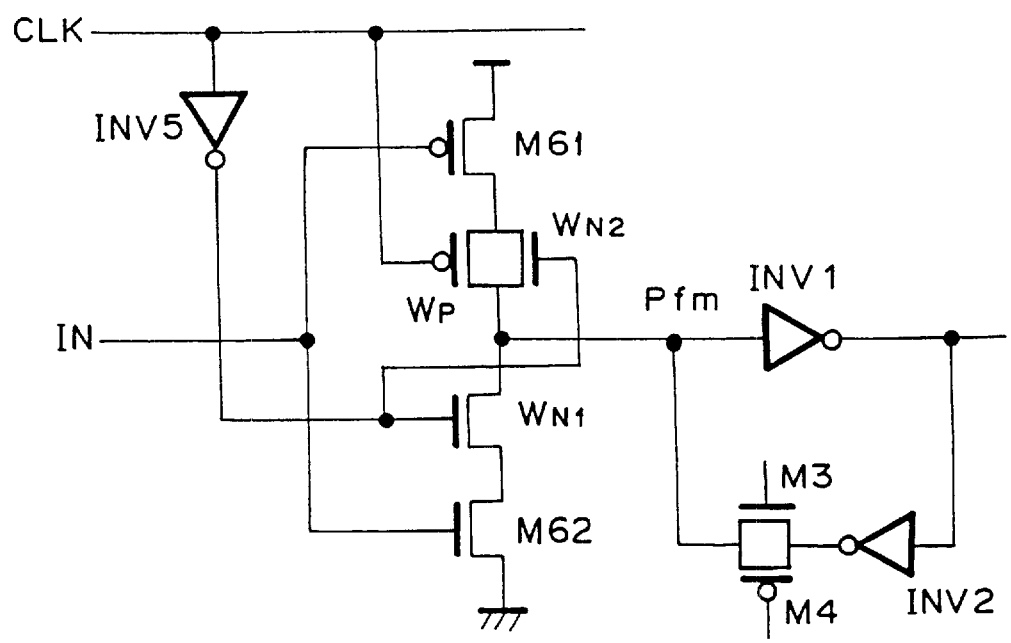
FIG. 6 is a schematic diagram showing the structure of a latch circuit according to a fourth embodiment of the present invention.

FIG. 6 shows the structure of a fourth embodiment of the present invention. As with the third embodiment, according to the fourth embodiment, when data is latched corresponding to the change of the signal level of a clock signal, noise is prevented from being applied to a floating connection point. FIG. 6 shows the structure of a clocked inverter type latch circuit of a register circuit. To prevent the switching speed of the register from being affected by input data, the register should be designed so that the size of a PMOS is twice as large as the size of an NMOS. However, in this structure, the PMOS side is more affected by noise. Thus, when data is latched, the voltage at the connection point Pfm floats. To prevent this problem, the size of the PMOS to which the clock signal CLK is input is reduced. A pull-up NMOS to which the clock signal CLK is input is disposed in parallel with a PMOS to which the clock signal CLKB is input.

The ideal relation between a pull-down NMOS and a pull-up NMOS is given by the following formula (4).

$$Cgp\ Wp = Cgn\ (Wn1 + Wn2) \tag{4}$$

where Wn1 is the size of the pull-down NMOS; and WN2 is the size of the pull-up NMOS.

Thus, when data is latched to the latch circuit, noise applied to the floating connection point is offset by the PMOS and the NMOS. Consequently, the noise does not cause a voltage to fluctuate at the connection point.

[Fifth Embodiment]

Figure 7:
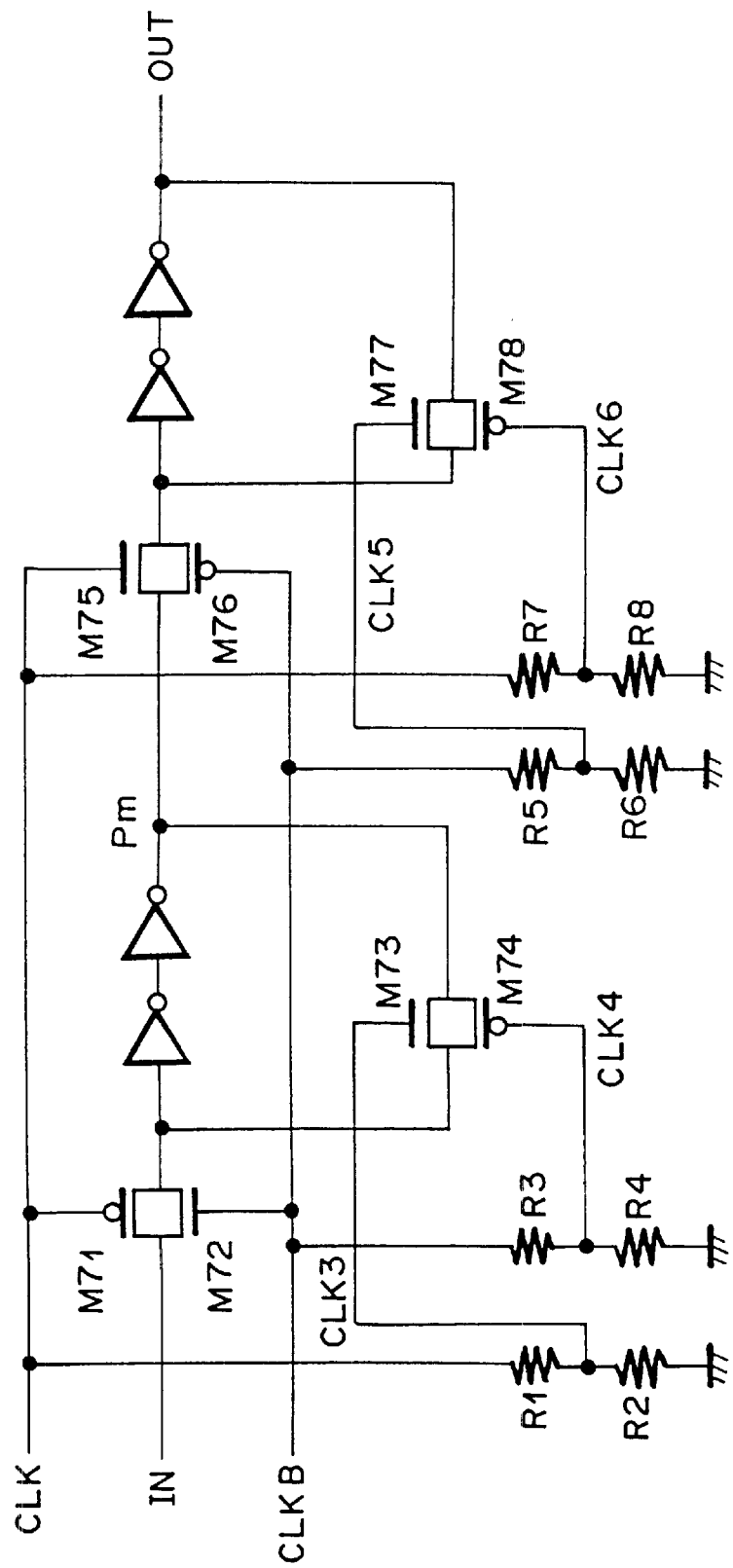
FIG. 7 is a schematic diagram showing the structure of a latch circuit and a register circuit according to a fifth embodiment of the present invention.

FIG. 7 shows the structure of a fifth embodiment of the present invention. According to the fifth embodiment, a latch pulse generating portion that generates latch pulses with a predetermined delay equivalent to clock signals CLK1 and CLK2 according to the first embodiment is accomplished by a transient response circuit that dulls the waveform of a signal with a high resistor.

As with the first embodiment, input transfer circuits of a master side latch circuit and a slave side latch circuit are turned on and off with a clock signal CLK and an inverted clock signal CLKB of the clock signal CLK. The clock signal CLK is inverted as the inverted clock signal CLKB by an inverter (not shown). A hold transfer circuit of the master side latch circuit is composed of an NMOS M73 and a PMOS M74 connected in parallel. When these MOS transistors are turned on, a flip-flop circuit is formed and data is latched.

As a gate signal of the NMOS M73, a clock signal CLK3 is input from an intermediate connection point of registers R1 and R2 connected in series between the clock signal CLK and a lowest power voltage (GND) as a reference voltage. As a gate signal of the PMOS M74, a clock signal CLK4 is input from an intermediate connection point of registers R3 and R4 connected in series between the inverted clock signal CLKB and a maximum power supply voltage (VDD). As with the master side hold transfer circuit, the slave side hold transfer circuit is composed of an NMOS M77 and a PMOS M78. However, as gate input signals, a clock signal CLK5 and a clock signal CLK6 are input. The clock signal CLK5 is input from an intermediate connection point of registers R5 and R6 connected between the inverted clock signal CLKB and the GND. The clock signal CKL6 is input from an intermediate connection point of resistors R7 and R8 connected between the clock signal CLK and the VDD.

The resistance of each of the resistors R1 to R8 is on the order of Mega-ohms. These resistors may be disposed for each register or in common with a plurality of registers (in this case, the clock signals CLK3 to CLK6 are in common with one clock signal).

In a low frequency operation of the register, when data is latched to the master side latch circuit, the clock signal CLK3 of the master side latch circuit becomes an intermediate voltage corresponding to the ratio of resistors R1 and R2. Thus, the clock signal CLK3 causes the NMOS M73 to be turned on. Likewise, the clock signal CLK4 is an intermediate volage corresponding to the ratio of the resistors R3 and R4. Thus, the clock signal CLK4 causes the PMOS M74 to be turned on. The operation of the slave side latch circuit is the same as the operation of the master side latch circuit.

Since the clock signals CLK3 to CLK6 are equivalent to signal loads of high resistors from the view point of the clock signals CLK and CLKB, the signals CLK3 to CLK6 do not affect the speed of signal changes. In a high frequency operation of the register, since the time constants of the clock signals CLK3 to CLK6 are long, the resistor cannot follow the changes of the signals. Thus, the voltages of the clock signals CLK3 and CLK5 lower, whereas the voltages of the clock signals CLK4 and CLK6 rise. Consequently, the switching performance of the hold transfer circuits deteriorates. As a result, when a signal frequency exceeds a predetermined frequency, the hold transfer circuits are always turned on.

According to the fifth embodiment, when the resister is changed from latch state to through state, the turn off speed of the hold transfer circuits delays. Since the gate volage is an intermediate voltage, the performance of the transfer circuits is very low. Thus, the reduction of the transfer speed of the signals of the input transfer circuits is slight. However, the reduction does not take place when input data is a high frequency signal. Thus, when the register is operated at a high frequency for high speed data output, such a problem does not take place.

When high resistors are formed with diffused resistors of a poly-silicon layer, since they can be laid out on another transistor, the area of the register circuit does not increase at all. In addition, it is not necessary to provide a special latch signal (other than the basis clock signal) and a generating circuit thereof. Thus, the circuit characteristics of the present invention can be accomplished without an increase of the installation area against the conventional circuit.

According to the first to fifth embodiments, two staged latch circuits were described. However, when a plurality of stages of latch circuits are tandem-connected, a multi-bit register circuit can be structured. An inverter circuit of each latch circuit is composed of a PMOS and an NMOS that are tandem-connected between a power supply and a reference voltage. An input digital signal is input to the gates of these transistors. An output signal is obtained from the drains of these transistors as the connection point thereof. Thus, both a latch circuit and a register circuit can be integrally fabricated in a MOS process.

According to the present invention, data received from an input terminal IN is input to the source and drain of a PMOS M1 and an NMOS M2 connected in parallel as a transfer circuit. A reference clock signal is input to the gate of the PMOS M1 of the transfer circuit. An output terminal of the transfer circuit is connected to an output driving inverter. An output signal of the output driving inverter is input to a connection point Pm. The connection point Pm is connected to a latch pass inverter. An output signal of the latch pass inverter is input to a data hold transfer circuit. The output signal of the data hold transfer circuit is input to the output terminal of the input transfer circuit. The input transfer circuit and the data hold transfer circuit compose a latch circuit. A clock signal with a predetermined delay against the reference clock signal is input to the data hold transfer circuit. Thus, the load of the clock signal line for controlling the operation of the register circuit can be reduced. In addition, the data release switching operation of the register circuit can be performed at high speed. Moreover, when the register circuit is operated at high frequency, the power consumption of the register can be suppressed from increasing.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A latch circuit comprising:

a first transfer for inputting and outputting an input signal of the latch circuit corresponding to a reference clock signal supplied to a control gate of said first transfer;

a first inverter for inverting an output signal of said first transfer;

a second inverter for inverting an output signal of said first inverter; and a second transfer for inputting an output signal of said second inverter and outputting it to said first inverter, wherein a second clock signal is input to a control gate of said second transfer, a signal level of the second clock signal becoming a first logical level with a predetermined delay from a leading edge of the reference clock signal and then becoming a second logical level corresponding to a trailing edge of the reference clock signal.

2. The latch circuit as set forth in claim 1, wherein the output signal of said first transfer is latched after the predetermined delay from the leading edge of the reference clock signal.

3. The latch circuit as set forth in claim 1, wherein when a period from the leading edge to trailing edge of the reference clock becomes shorter than the predetermined delay, the signal level of the second clock is kept at the second logical level, whereby said second transfer is kept in a non-connected state.

4. The latch circuit as set forth in claim 1, wherein said first transfer is a clocked inverter circuit comprising a first transistor and a second transistor connected in series between a power supply and a reference voltage, the reference clock signal being input to a gate of the first transistor, the input signal of the latch circuit being input to a gate of the second transistor, the first transistor being disposed on the power supply side, and the second transistor being disposed on the reference voltage side.

5. The latch circuit as set forth in claim 4,
wherein the first transistor is a pull-up PMOS transistor, wherein the second transistor is a pull-down NMOS transistor, wherein said clocked inverter circuit further comprises a pull-up NMOS transistor connected with the first transistor in parallel; and wherein an inverted clock signal of the reference clock signal is input to a gate of the pull-up NMOS transistor.

6. The latch circuit as set forth in claim 1,
wherein said first transfer comprises a clocked inverter.

7. The latch circuit as set forth in claim 6,
wherein said clocked inverter comprises:
 a first PMOS transistor, second PMOS transistor, first NMOS transistor and second NMOS transistor which are connected in series and in this order,
 wherein the input signal of said first transfer is input to a gate of one of the PMOS transistors and a gate of one of the NMOS transistors,
 wherein the reference clock signal is input to a gate of the other of the PMOS transistors,
 wherein an inverted clock signal of the reference clock signal is input to a gate of the other of the NMOS transistors, and
 wherein the output signal of said first transfer is derived from a joint between said second PMOS transistor and said first NMOS transistor.

8. The latch circuit as set forth in claim 1,
wherein a combination of said second inverter and said second transfer comprises a clocked inverter.

9. The latch circuit as set forth in claim 8,
wherein said clocked inverter comprises:
 a first PMOS transistor, second PMOS transistor, first NMOS transistor and second NMOS transistor which are connected in series and in this order,
 wherein the input signal of said second inverter is input to a gate of one of the PMOS transistors and a gate of one of the NMOS transistors,
 wherein the second clock signal is input to a gate of the other of the PMOS transistors,
 wherein an inverted clock signal of the second clock signal is input to a gate of the other of the NMOS transistors, and
 wherein the output signal of said second transfer is derived from a joint between said second PMOS transistor and said first NMOS transistor.

10. A latch circuit comprising:
a first transfer for inputting and outputting an input signal of the latch circuit corresponding to a reference clock signal supplied to a control gate of said first transfer;
a first inverter for inverting an output signal of said first transfer;
a second inverter for inverting an output signal of said first inverter; and
a second transfer for inputting an output signal of said second inverter and outputting it to said first inverter;
wherein a second clock signal is input to a control gate of said second transfer, a signal level of the second clock signal becoming a first logical level with a predetermined delay from a leading edge of the reference clock signal and then becoming a second logical level with the predetermined delay from a trailing edge of the reference clock signal, and
wherein the second clock signal is turned on/off with a time constant comprising at least said predetermined delay through a delay of a resistor from the reference clock signal.

11. A register circuit, comprising:
a first transfer for inputting and outputting an input signal of the register circuit corresponding to a reference clock signal supplied to a control gate of said first transfer;
a first inverter for inverting an output signal of said first inverter;
a second inverter for inverting an output signal of said first inverter;
a second transfer for inputting an output signal of said second inverter and outputting it to said first inverter;
a third transfer for inputting and outputting the output signal of the first inverter corresponding to the reference clock signal supplied to a control gate of said third transfer;
a third inverter for inverting an output signal of said third transfer;
a fourth inverter for inverting an output signal of said third inverter; and
a fourth transfer for inputting an output signal of said fourth inverter and outputting it to said third inverter,
wherein a second clock signal is input to a control gate of said second transfer, a signal level of the second clock signal becoming a first logical level with a predetermined delay from a leading edge of the reference clock signal and then becoming a second logical level corresponding to a trailing edge of the reference clock signal; and
wherein a third clock signal is input to a control gate of said fourth transfer, a signal level of the third clock signal becoming the first logical level with a predetermined delay from the trailing edge of the reference clock signal and then becoming the second logical level corresponding to the leading edge of the reference clock signal.

12. The register circuit as set forth in claim 11,
wherein the output signal of said first transfer is latched after the predetermined delay from the leading edge of the reference clock signal, and
wherein the output signal of said third transfer is latched after the predetermined delay from the trailing edge of the reference clock signal.

13. The register circuit as set forth in claim 11,
wherein when a period from the leading edge to trailing edge of the reference clock becomes shorter than the predetermined delay, the signal level of the second clock is kept at the second logical level, whereby said second transfer is kept in a non-connected state, and
wherein when a period from the trailing edge to leading edge of the reference clock becomes shorter than the predetermined delay, the signal level of the third clock is kept at the second logical level, whereby said fourth transfer is kept in a non-connected state.

14. The register circuit as set forth in claim 11,
wherein said first transfer is a first clocked inverter circuit comprising a first transistor and a second transistor connected in series between a power supply and a reference voltage, the reference clock signal being input to a gate of the first transistor, the input signal of the register circuit being input to a gate of the second transistor, the first transistor being disposed on the power supply side, and the second transistor being disposed on the reference voltage side, and
wherein said third transfer is a second clocked inverter circuit comprising a third transistor and a fourth transistor connected in series between a power supply and a reference voltage, an inverted clock signal of the reference clock signal being input to a gate of the third transistor, the input signal of the third transfer being input to a gate of the fourth transistor, the third transistor being disposed on the power supply side, and the fourth transistor being disposed on the reference voltage side.

15. The register circuit as set forth in claim 14, wherein the first transistor is a pull-up PMOS transistor, wherein the second transistor is a pull-down NMOS transistor, wherein said first clocked inverter circuit further comprises a first pull-up NMOS transistor connected with the first transistor in parallel, wherein an inverted clock signal of the reference clock signal is input to a gate of the first pull-up NMOS transistor, wherein the third transistor is a pull-up PMOS transistor, wherein the fourth transistor is a pull-down NMOS transistor, wherein said second clocked inverter circuit further comprises a second pull-up NMOS transistor connected with the third transistor in parallel, and wherein the reference clock signal is input to a gate of the second pull-up NMOS transistor.

16. The register circuit as set forth in claim 11, wherein said first transfer comprises a first clocked inverter, and wherein said third transfer comprises a second clocked inverter.

17. The register circuit as set forth in claim 16, wherein said first clocked inverter comprises:
a first PMOS transistor, second PMOS transistor, first NMOS transistor and second NMOS transistor which are connected in series and in this order,
wherein the input signal of said first transfer is input to a gate of one of the first and second PMOS transistors and a gate of one of the first and second NMOS transistors,
wherein the reference clock signal is input to a gate of the other of the first and second PMOS transistors,
wherein an inverted clock signal of the reference clock signal is input to a gate of the other of the first and second NMOS transistors,
wherein the output signal of said first transfer is derived from a joint between said second PMOS transistor and said first NMOS transistor, wherein said third clocked inverter comprises:
a third PMOS transistor, fourth PMOS transistor, third NMOS transistor and fourth NMOS transistor which are connected in series and in this order,
wherein the input signal of the third transfer is input to a gate of one of the third and fourth PMOS transistors and a gate of one of the third and fourth NMOS transistors,
wherein an inverted clock signal of the reference clock signal is input to a gate of the other of the third and fourth PMOS transistors,
wherein the reference clock signal is input to a gate of the other of the third and fourth NMOS transistors, and
wherein the output signal of the third transfer is derived from a joint between said fourth PMOS transistor and said third NMOS transistor.

18. The register circuit as set forth in claim 11, wherein a combination of said second inverter and said second transfer comprises a first clocked inverter, and wherein a combination of said fourth inverter and said fourth transfer comprises a second clocked inverter.

19. The register circuit as set forth in claim 18, wherein said first clocked inverter comprises:
a first PMOS transistor, second PMOS transistor, first NMOS transistor and second NMOS transistor which are connected in series and in this order,
wherein the input signal of said second inverter is input to a gate of one of the first and second PMOS transistors and a gate of one of the first and second NMOS transistors,
wherein the second clock signal is input to a gate of the other of the first and second PMOS transistors,
wherein an inverted clock signal of the second clock signal is input to a gate of the other of the first and second NMOS transistors,
wherein the output signal of said second transfer is derived from a joint between said second PMOS transistor and said first NMOS transistor, wherein said second clocked inverter comprises:
a third PMOS transistor, fourth PMOS transistor, third NMOS transistor and fourth NMOS transistor which are connected in series and in this order,
wherein the input signal of said fourth inverter is input to a gate of one of the third and fourth PMOS transistors and a gate of one of the third and fourth NMOS transistors,
wherein the third clock signal is input to a gate of the other of the third and fourth PMOS transistors,
wherein an inverted clock signal of the third clock signal is input to a gate of the other of the third and fourth NMOS transistors, and
wherein the output signal of said fourth transfer is derived from a joint between said fourth PMOS transistor and said third NMOS transistor.

\* \* \* \* \*